United States Patent

Hsien et al.

[11] Patent Number: 6,166,974
[45] Date of Patent: Dec. 26, 2000

[54] DYNAMIC PRECHARGE REDUNDANT CIRCUIT FOR SEMICONDUCTOR MEMORY DEVICE

[75] Inventors: Chia-Yi Hsien, Hsin-Tso-Tsai; Chih-Cheng Chen, Changhua Hsien; Hon-Shing Lau, Hsinchu, all of Taiwan

[73] Assignee: Vanguard International Semiconductor Corp., Hsinchu, Taiwan

[21] Appl. No.: 09/429,595

[22] Filed: Oct. 28, 1999

[51] Int. Cl.$^7$ ........................................ G11C 7/00
[52] U.S. Cl. ................... 365/200; 365/225.7; 365/189.5
[58] Field of Search ................... 365/200, 275.7, 365/189.5

[56] References Cited

U.S. PATENT DOCUMENTS

| | | | |
|---|---|---|---|
| 5,583,463 | 12/1996 | Merritt | 327/526 |
| 5,841,708 | 11/1998 | Nagata | 365/200 |
| 6,052,767 | 4/2000 | Matuki | 711/202 |

*Primary Examiner*—Richard Elms
*Assistant Examiner*—Hien Nguyen
*Attorney, Agent, or Firm*—J. C. Patents; Jiawei Huang

[57] ABSTRACT

A dynamic precharge redundant circuit for a semiconductor memory device. A PMOS transistor, a fuse, a first, second and third inverters, a first switch and a second switch are applied. A source of the PMOS transistor is coupled to a voltage supply, while a gate of the PMOS transistor is to receive a precharge signal. The fuse has a ground terminal and a terminal coupled to the drain of the PMOS transistor of which the drain is further coupled to an input terminal of the first inverter. The fuse is also coupled to a column address signal. The first inverter has an output terminal coupled to an input terminal of the first switch. The second inverter has an input terminal coupled to an output terminal of the first switch and an output terminal coupled to an input terminal of the third inverter, so as to output a bit-switch control signal. An input terminal of the second switch is coupled to an output terminal of the third inverter, while an output terminal of the second switch is coupled to both the output terminal of the first switch and the input terminal of the second inverter. Thus, an error caused by the generation of an interference signal of the bit-switch control signal is prevented, so as to prevent from damaging data of the bit line sense amplifier.

9 Claims, 3 Drawing Sheets

DYNAMIC PRECHARGE REDUNDANT CIRCUIT FOR SEMICONDUCTOR MEMORY DEVICE

BACKGROUND OF THE INVENTION

1. Field of the Invention

The invention relates in general to a semiconductor memory device. More particularly, this invention relates a redundant circuit for a semiconductor memory device that effectively avoids the generation of an interference signal in a dynamic precharge logic.

2. Description of the Related Art

While fabricating a semiconductor memory device such as a dynamic random access memory (DRAM) or a synchronous dynamic random access memory (SDRAM), a high yield is demanded. When a semiconductor memory device includes several defect memory cells, or even when only one defect memory cell exists, the memory device is a failed product. For a device with a high integration, the possibility of containing more defect memory cells is much higher than that with a low integration. As a consequence, the yield is decreased with increasing the integration.

As the fabrication process of semiconductor memory devices becomes more and more advanced, the packaging density becomes more and more complex and the technique thereof is more and more difficult. During the fabrication process, the existence of contamination or particles is inevitable, so that the yield is reduced. In the conventional technique, a method of fabricating a redundant circuit to result in a required yield is employed. The technique provides a redundant circuit in addition to the memory array for storing binary data, so as to substitute the defect memory cells. Each redundant memory cell is coupled to a word line and a bit line respectively. If memory array are found to be faulty, the redundant memory cells are to replace the position of these defect memory cells. Therefore, a defect-less memory chip is fabricated.

In other words, in addition to a main memory array, a backup memory array (or a redundant memory array) is formed to replace those defect memory cells in the main memory array. The memory device with both the main memory array which contains defect memory cells and the redundant memory array can be operated as a defect-less memory device.

The redundant memory array is typically formed in a periphery of the main memory array. The redundant memory array is very often connected with the main memory array via a fuse. The fuse may be blown by a laser light beam or a current flow. While repairing defect memory cells, the fuse can be open by applying a current or a laser light beam. The fuse remains close while the repairing step is not performed.

In the design of a DRAM, the dynamic precharge logic circuit can be used to design a redundant circuit. The processing speed of this kind of redundant circuit is much faster than that of the static gate.

Moreover, in the design of a high speed memory device, the pulse width may be across two clock cycle times. That is, when the clock signal CLK is raised to a high potential level, the bit-switch control signal may still remain in a high potential level. Thus, the interference signal generated by a precharge dynamic circuit may enable two or more than two bit-switch control signals simultaneously.

FIG. 1 shows a circuit diagram of a conventional redundant circuit. The redundant includes a PMOS transistor 10, a fuse 12 and inverters 14 and 16. The source of the PMOS transistor 10 is coupled to a voltage supply VCC, the gate of the PMOS transistor 10 is receive a precharge signal npre, the drain of the PMOS transistor is coupled to the fuse 12. The fuse 12 has a grounded terminal and a terminal coupled to an address signal CA. The inverter 14 has an input terminal coupled to the drain of the PMOS transistor 10, and an output terminal coupled to an input terminal of the inverter 16. The inverter 16 outputs an output bit-switch control signal rbsc.

Referring to both FIG. 1 and FIG. 2, waveforms of signals such as the clock signal CLK, address signal CA, precharge signal npre, node A, node B and the conventional bit-switch control signal rbsc of various potential levels are illustrated. When the clock signal CLK raises up to a high potential level (High), the precharge signal npre becomes at a low potential level (Low). Meanwhile, the PMOS transistor 10 is turned on to precharge the node A up to the voltage level of the voltage supply VCC. If the column address signal CA is matched with the repaired address, the fuse 12 is open. At the moment, the node A is at a high level, and the node B is at a low level, while the bit-switch control signal rbsc is maintained at a high level. In contrast, if the column address signal CA is not matched with the repaired address, the fuse 12 is remained close. Therefore, a path is established from node A to ground, so that the node A is switched to a low level.

However, as mentioned above, the pulse width of the bit-switch control signal can be across two clock cycle times. That is, when the clock signal CLK raises to a high level, the bit-switch control signal may still remain in a high level as shown as the waveform of bsc. Thus, at the precharge node A, an interference signal 52 may be generated which may destroy the data shown in a bit line sense amplifier. For outputting the normal bit-switch control signal bsc, it is obvious that the bit-switch control signal bsc may generate an interference signal 52.

SUMMARY OF THE INVENTION

The invention provides a redundant circuit of a semiconductor memory device. The redundant circuit comprises a PMOS transistor, a fuse, a first inverter, a second inverter, a third inverter, a first switch and a second switch. A source of the PMOS transistor is coupled to a voltage supply, and a gate of the PMOS transistor is to receive a precharge signal. The fuse has a terminal connected ground, another terminal coupled to a drain of the PMOS transistor, and is further coupled to a column address signal. An input terminal of the first inverter is coupled to a drain of the PMOS transistor. The first switch has an input terminal coupled to an output terminal of the first inverter. An input terminal of the second inverter is coupled to an output terminal of the first switch which is used to output a bit-switch control signal. The third inverter has an input terminal coupled to an output signal of the second inverter. An input terminal of the second switch is coupled to an output terminal of the third inverter, and an output terminal of the second switch is further coupled to an output of the first switch. The first and the second switches are turned on/off according to a potential level of the precharge signal.

In the redundant circuit of the semiconductor memory device, an interference signal is prevented from being generated at the bit-switch control signal during the precharge period. Therefore, the data of the bit line sense amplifier can be preveted from being destroyed.

Both the foregoing general description and the following detailed description are exemplary and explanatory only and are not restrictive of the invention, as claimed.

DESCRIPTION OF THE PREFERRED EMBODIMENTS

Figure 3:
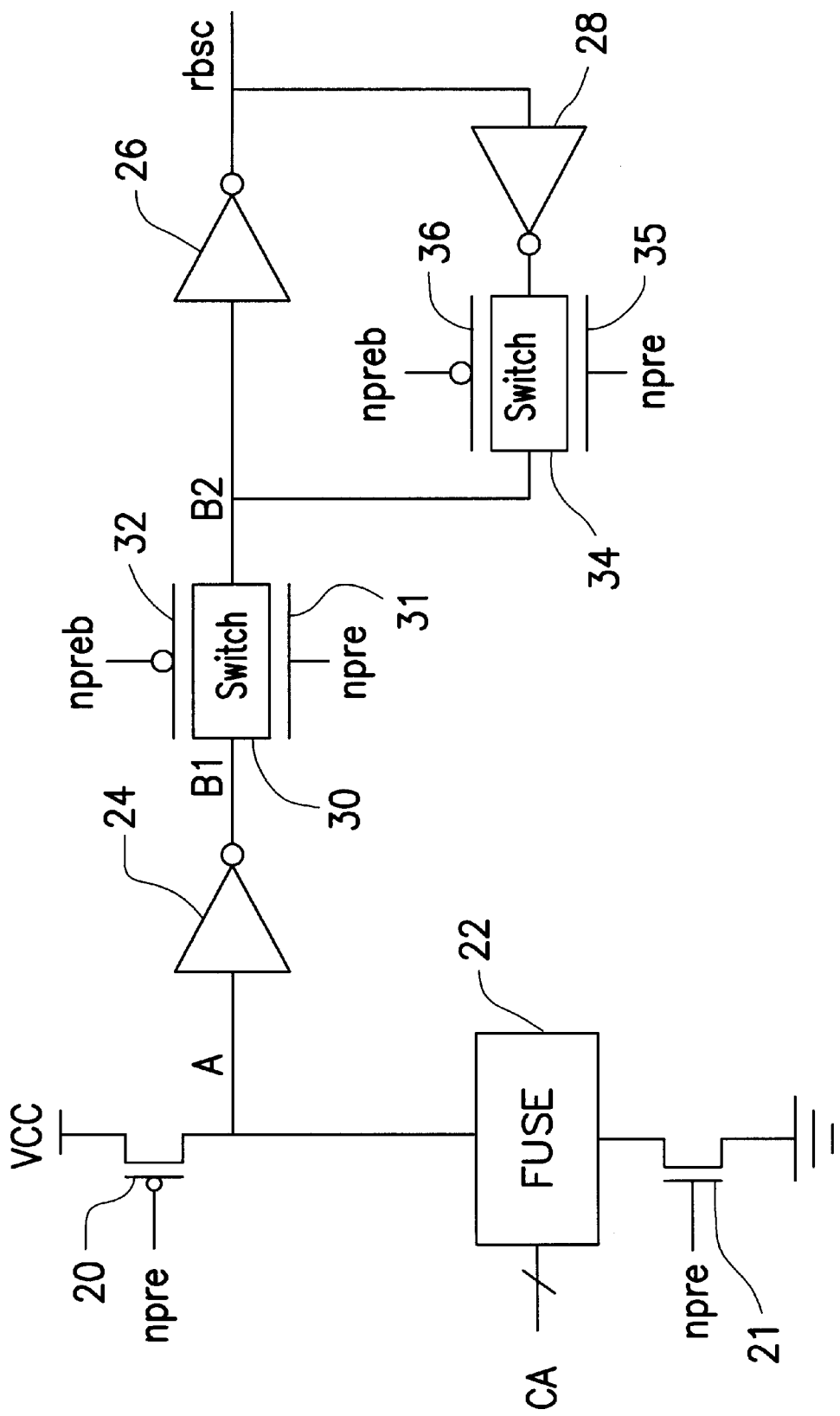
FIG. 3 shows a circuit diagram of a redundant circuit of a semiconductor memory device.

Referring to FIG. 3, an embodiment of the invention which provides a redundant circuit of a semiconductor memory device is illustrated. The redundant circuit comprises a PMOS transistor 20, a fuse 22, inverters 24, 26 and 28, and switches 30 and 34. For example, the fuse 22 comprises a polysilicon fuse. The switch 30 comprises a NMOS transistor 31 and a PMOS transistor 32 connected in parallel. The gates of the NMOS transistor 31 and the PMOS transistor 32 are to receive precharge signals npre and npreb, respectively. The switch 34 comprises a NMOS 35 and a PMOS 36 connected with each other in parallel. The gates of the NMOS 35 and the PMOS 36 are to receive the precharge signals npre and npreb, respectively. The precharge signals npre and npreb are complementary. For example, when the precharge signal npre is H, the precharge signal npreb is L.

The PMOS transistor 20 has a source coupled to a voltage supply VCC, a gate to receive the precharge signal npre, and a drain coupled to the fuse 22. The fuse has a terminal connected ground and is further connected to a column address signal CA. The inverter 24 has an input terminal coupled to a drain of the PMOS transistor 20, and an output terminal coupled to an input terminal of the switch 30. The switch 30 further includes an output terminal coupled to both an input terminal of the inverter 26 and an output terminal of the switch 34. An output terminal of the inverter 26 is coupled to an input terminal of the inverter 28 to output a bit-switch control signal rbsc.

Figure 1:
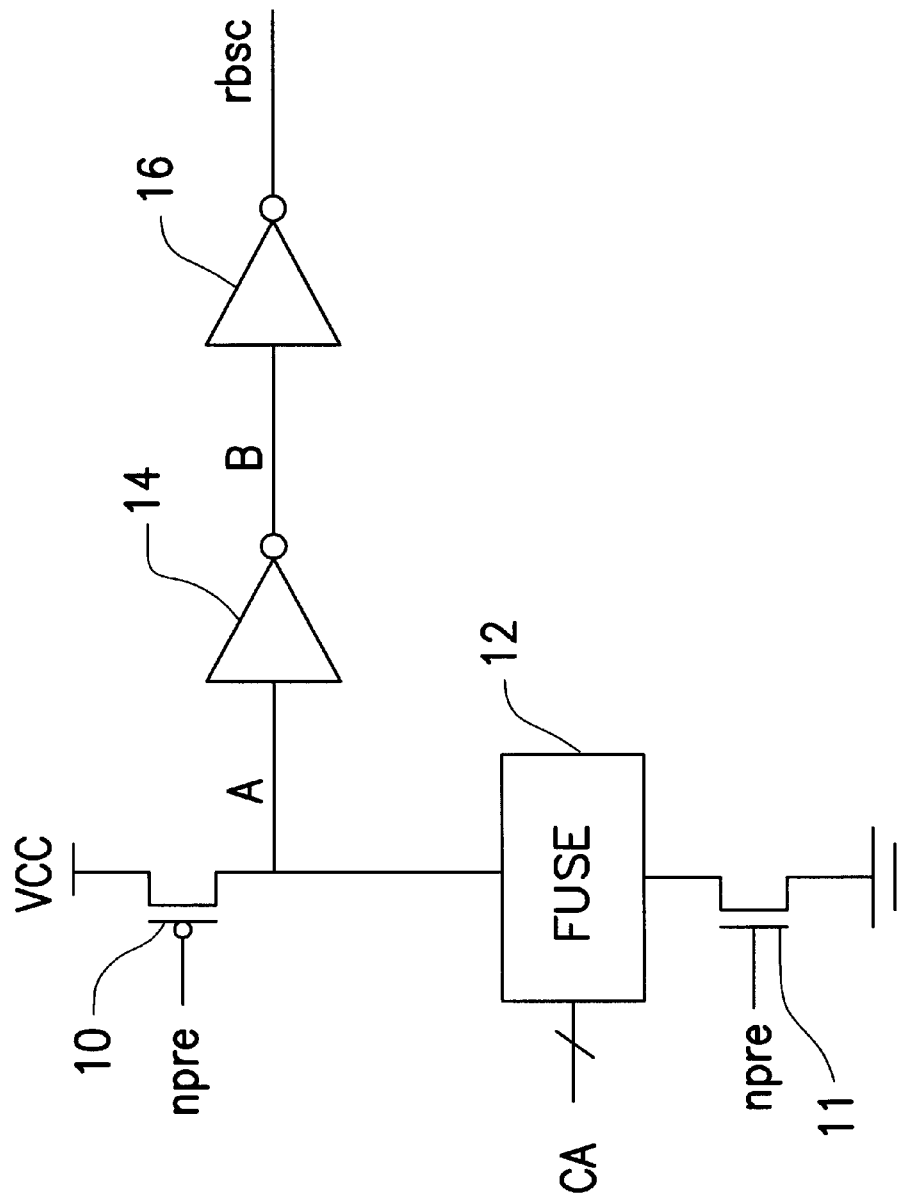
FIG. 1 shows a circuit diagram of a conventional redundant circuit of a semiconductor memory device.
Figure 2:
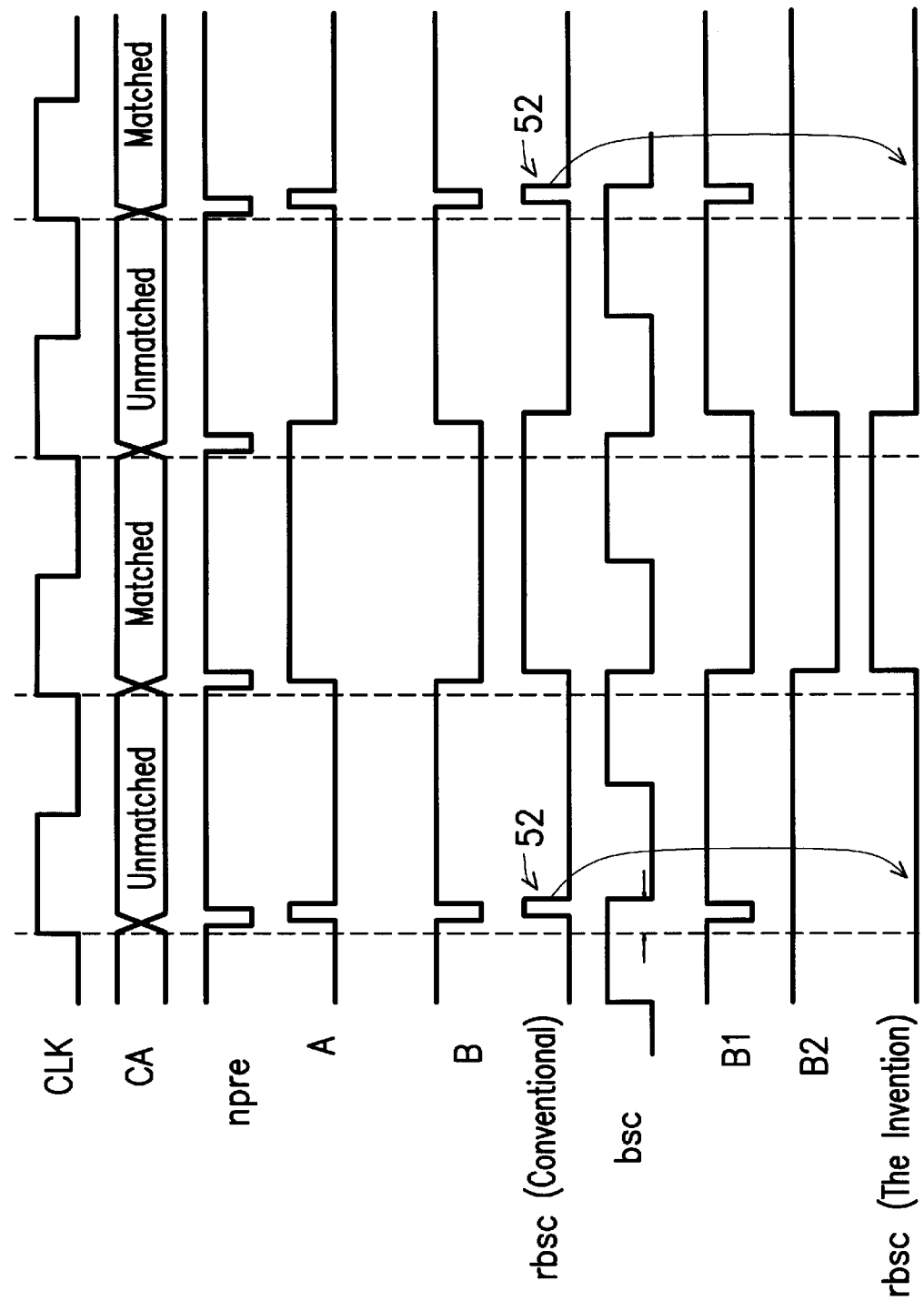
FIG. 2 shows waveforms for signals at various potential levels.

Referring to both FIG. 2 and FIG. 3, when the clock signal CLK raises up to H, the precharge signal npre becomes L, so that the PMOS transistor 20 is turned on to precharge the node A up to the voltage VCC. Meanwhile, the node B1 is L, so that he switches 30 and 34 are turned off. The node B2 is H, and the bit-switch control signal rbsc is maintained at L.

When the column address signal CA is matched with a repaired address, the fuse 22 is open, and the precharge signal npre is raised up to H to turn on the switches 30 and 34. Meanwhile, the node A is H, the node B1 is L and the node B2 is L, so that the bit-switch control signal rbsc is maintained at H. On the contrary, if the column address signal CA is not matched with the repaired address, the fuse 22 is remained close, so that a path is established from the node A to ground to lower the potential level of the node A down to L. In FIG. 2, the relative waveforms of various potential levels of the clock signal CLK, the column address signal CA, the precharge signal npre, the node A, the nodes A, B1 and B2, and the bit-switch control signal rbsc are shown.

It is possible that the pulse width of the bit-switch control signal to be across two clock cycle times. That is, after the clock signal CLK is raised to H, the bit-switch control signal may remain H. However, during the precharging period of the node A, the switch 30 is not turned on. In other words, the switch 30 is turned on after the precharge operation of the node A. Therefore, the bit-switch control signal rbsc is not affected by precharge of the node A. It is seen from the figure that the generation of the interference signal can be prevented.

In other words, the switch 30 outputs the signal rbsc after the precharge pulse pass through, while the switch 34 keeps outputting during the precharge pulse. That is, during precharge period, the switch 30 is disable. The switch 20 is enable after the operation of precharge. Thus, the interference signal is prevented from being generated, so that the data of the bit line sense amplifier is not destroyed.

Thus, in the invention, the interference signal generated at bit-switch control signal in the conventional redundant circuit is eliminated. Therefore, the data of the bit line sense amplifier can be protected from being destroyed.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A redundant circuit of a semiconductor memory device, comprising:

a PMOS transistor, including a source coupled to a voltage supply with a voltage VCC, a gate to receive a precharge signal, and a drain;

a fuse, including a terminal connected to ground, another terminal coupled to the drain of the PMOS transistor, and the fuse being coupled to a column address signal;

a first inverter, including an input terminal coupled to the drain of the PMOS transistor and an output terminal;

a switch, including an input terminal coupled to the output of the first inverter, and the switch being turned on/off according to a potential level of the precharge signal; and a second inverter, including an input terminal coupled to the output terminal of the switch and an output terminal to output a bit-switch control signal.

2. The redundant circuit according to claim 1, wherein the switch comprises further a NMOS transistor and a PMOS transistor connected in parallel, the NMOS transistor has a gate to receive the precharge signal, and the PMOS transistor has a gate to receive another precharge signal complementary to the precharge signal.

3. The redundant circuit according to claim 1, wherein while the precharge signal is at a low potential level, the switch is off, and while the precharge signal is at a high potential level, the switch is on.

4. The redundant circuit according to claim 1, wherein the semiconductor memory device includes a dynamic random access memory.

5. A redundant circuit of a semiconductor memory device, comprising:

a PMOS transistor, including a source coupled to a voltage supply with a voltage, a gate to receive a first precharge signal, and a drain;

a fuse, including a terminal connected to ground, a terminal coupled to the drain of the PMOS transistor, and the fuse being further coupled to a column address signal;

a first inverter, including an input terminal coupled to the drain of the PMOS transistor and an output terminal;

a first switch, including an input terminal coupled to the output terminal of the first inverter and an output terminal, the first switch being turned on or turned off according to the first precharge signal;

a second inverter, including an input terminal coupled to the output terminal of the first switch and to output a bit-switch control signal at an output terminal;

a third inverter, including an input terminal coupled to the output terminal of the second inverter and an output terminal; and a second switch, including an input terminal coupled to the output terminal of the third inverter and an output terminal coupled to the output terminal of the first switch, the second switch being turned on or turned off according to a potential level of the first precharge signal.

6. The redundant circuit device according to claim 5, wherein the first switch comprises a NMOS transistor and a PMOS transistor connected in parallel, the NMOS has a gate to receive the first precharge signal, while the PMOS has a gate to receive a second precharge signal complementary to the first precharge signal.

7. The redundant circuit according to claim 6, wherein the second switch comprises a NMOS transistor and a PMOS transistor connected in parallel, the NMOS has a gate to receive the first precharge signal and the PMOS has a gate to receive the second precharge signal.

8. The redundant circuit device according to claim 5, wherein the first switch and the second switch are turned off when the first precharge signal is at a low potential level, and the first and the second switches are turned off when the first precharge signal is at a high potential.

9. The redundant circuit according to claim 5, wherein semiconductor memory device comprises a synchronous dynamic random access memory.

* * * * *

UNITED STATES PATENT AND TRADEMARK OFFICE
CERTIFICATE OF CORRECTION

PATENT NO.   : 6,166,974  
DATED        : December 26, 2000  
INVENTOR(S)  : Hsiao et al.

It is certified that error appears in the above-identified patent and that said Letters Patent is hereby corrected as shown below:

Title page,
Item [75], should read -- Chuan-Cheng Hsiao --

Signed and Sealed this

Twentieth Day of November, 2001

Attest:

*Nicholas P. Godici*

NICHOLAS P. GODICI
*Attesting Officer*   *Acting Director of the United States Patent and Trademark Office*